United States Patent
Oh et al.

(10) Patent No.: US 10,658,020 B2
(45) Date of Patent: May 19, 2020

(54) STROBE SIGNAL GENERATION CIRCUIT AND SEMICONDUCTOR APPARATUS INCLUDING THE SAME

(71) Applicant: SK hynix Inc., Icheon-si, Gyeonggi-do (KR)

(72) Inventors: Seung Wook Oh, Yongin-si (KR); Hyun Seung Kim, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/982,741

(22) Filed: May 17, 2018

(65) Prior Publication Data

US 2019/0198071 A1 Jun. 27, 2019

(30) Foreign Application Priority Data

Dec. 21, 2017 (KR) .................... 10-2017-0176828

(51) Int. Cl.
*G11C 7/22* (2006.01)
*G11C 7/24* (2006.01)
*G11C 7/10* (2006.01)
*G11C 11/4093* (2006.01)

(52) U.S. Cl.
CPC ............ *G11C 7/222* (2013.01); *G11C 7/1057* (2013.01); *G11C 7/1063* (2013.01); *G11C 7/1066* (2013.01); *G11C 7/24* (2013.01); *G11C 11/4093* (2013.01)

(58) Field of Classification Search
CPC .......... G11C 7/24; G11C 7/222; G11C 7/1063
See application file for complete search history.

(56) References Cited

U.S. PATENT DOCUMENTS

| | | | | |
|---|---|---|---|---|
| 8,896,354 B1* | 11/2014 | Hong | ................... | H03K 19/00 327/108 |
| 8,908,467 B2 | 12/2014 | Kwack | | |
| 2004/0052152 A1* | 3/2004 | Kono | .................. | G11C 7/1066 365/233.1 |
| 2005/0134304 A1* | 6/2005 | Lee | ...................... | G11C 7/1051 326/30 |
| 2006/0187740 A1* | 8/2006 | Janzen | ................. | G11C 7/1045 365/189.11 |
| 2007/0086267 A1* | 4/2007 | Kwak | ...................... | G11C 8/12 365/233.1 |
| 2008/0001622 A1* | 1/2008 | You | ..................... | H04L 25/0278 326/30 |
| 2008/0201596 A1* | 8/2008 | Cho | ........................ | G11C 7/22 713/401 |

(Continued)

*Primary Examiner* — Alexander H Taningco
*Assistant Examiner* — Kurtis R Bahr
(74) *Attorney, Agent, or Firm* — William Park & Assciates Ltd.

(57) ABSTRACT

A strobe signal generation circuit includes a trigger circuit configured to generate a pull-up signal and a pull-down signal according to a clock signal; a first main driver configured to generate a differential data strobe signal in response to receiving the pull-up signal and the pull-down signal; and a second main driver configured to generate an other differential data strobe signal in response to receiving the pull-up signal and the pull-down signal from among the at least one pull-down signal through opposite terminals than the first main driver received the pull-up signal and the pull-down signal.

14 Claims, 5 Drawing Sheets

(56) References Cited

U.S. PATENT DOCUMENTS

| | | | |
|---|---|---|---|
| 2009/0244994 A1* | 10/2009 | Kim .................... | G11C 7/1051 365/193 |
| 2010/0052751 A1* | 3/2010 | Abe .................... | G11C 7/1051 327/158 |
| 2010/0259294 A1* | 10/2010 | Choo .................... | G11C 7/04 326/30 |
| 2011/0050307 A1* | 3/2011 | Lin .................... | H03K 5/1565 327/175 |
| 2015/0364163 A1* | 12/2015 | Song .................... | G11C 7/1084 365/189.05 |

* cited by examiner

STROBE SIGNAL GENERATION CIRCUIT AND SEMICONDUCTOR APPARATUS INCLUDING THE SAME

CROSS-REFERENCES TO RELATED APPLICATIONS

The present application claims priority under 35 U.S.C. § 119(a) to Korean application number 10-2017-0176828, filed on Dec. 21, 2017, in the Korean Intellectual Property Office, which is incorporated herein by reference in its entirety.

BACKGROUND

1. Technical Field

Various embodiments generally relate to a semiconductor circuit, and more particularly, to a strobe signal generation circuit and a semiconductor apparatus including the same.

2. Related Art

A semiconductor circuit, for example, a DRAM or a FLASH memory may provide a strobe signal for notifying a recipient that the semiconductor circuit is outputting data in a read operation.

In the semiconductor circuit, because a memory region, a plurality of circuits for performing the input/output of data in cooperation with the memory region, and a circuit for generating a strobe signal are integrated, it is important to reduce circuit area as much as possible to minimize a layout of the semiconductor circuit and reduce power consumption.

SUMMARY

Various embodiments are directed to a strobe signal generation circuit capable of reducing a circuit area and power consumption, and a semiconductor apparatus including the same.

In an embodiment, a strobe signal generation circuit may include: a trigger circuit configured to generate a pull-up signal and a pull-down signal according to a clock signal; a first main driver configured to generate a differential data strobe signal in response to receiving the pull-up signal and the pull-down signal; and a second main driver configured to generate an other differential data strobe signal in response to receiving the pull-up signal and the pull-down signal from among the at least one pull-down signal through opposite terminals than the first main driver received the pull-up signal and the pull-down signal.

In an embodiment, a strobe signal generation circuit may include: a trigger circuit configured to generate a first pull-up signal, a second pull-up signal, a first pull-down signal and a second pull-down signal based on differential clock signals and an on-die termination signal; a first main driver configured to generate a differential data strobe signal in response to receiving the first pull-up signal and the first pull-down signal; and a second main driver configured to generate an other differential data strobe signal in response to receiving the second pull-up signal and the second pull-down signal through opposite terminals than the first main driver received the first pull-up signal and the first pull-down signal.

In an embodiment, a semiconductor apparatus may include: a core block including a memory cell array; a pad array including pads for input/output of data and pads for outputting differential data strobe signals for notifying a receiving side of output data; a data processing circuit configured to, in a read operation, serialize and drive parallel data outputted from the core block, by using a clock signal, and output resultant data through the pads for input/output of data to an exterior of the semiconductor apparatus; and a strobe signal generation circuit configured to generate the differential data strobe signals according to the clock signal, the strobe signal generation circuit including a trigger circuit configured to generate at least one pull-up signal and at least one pull-down signal according to the clock signal; a first main driver configured to generate a differential data strobe signal in response to receiving a pull-up signal from among the at least one pull-up signal and a pull-down signal from among the at least one pull-down signal; and a second main driver configured to generate an other differential data strobe signal by receiving an other pull-up signal from among the at least one pull-up signal and an other pull-down signal through opposite terminals than the first main driver received the pull-up signal and the pull-down signal.

DETAILED DESCRIPTION

Hereinafter, a strobe signal generation circuit and a semiconductor apparatus including the same will be described below with reference to the accompanying drawings through various example embodiments.

Figure 1:
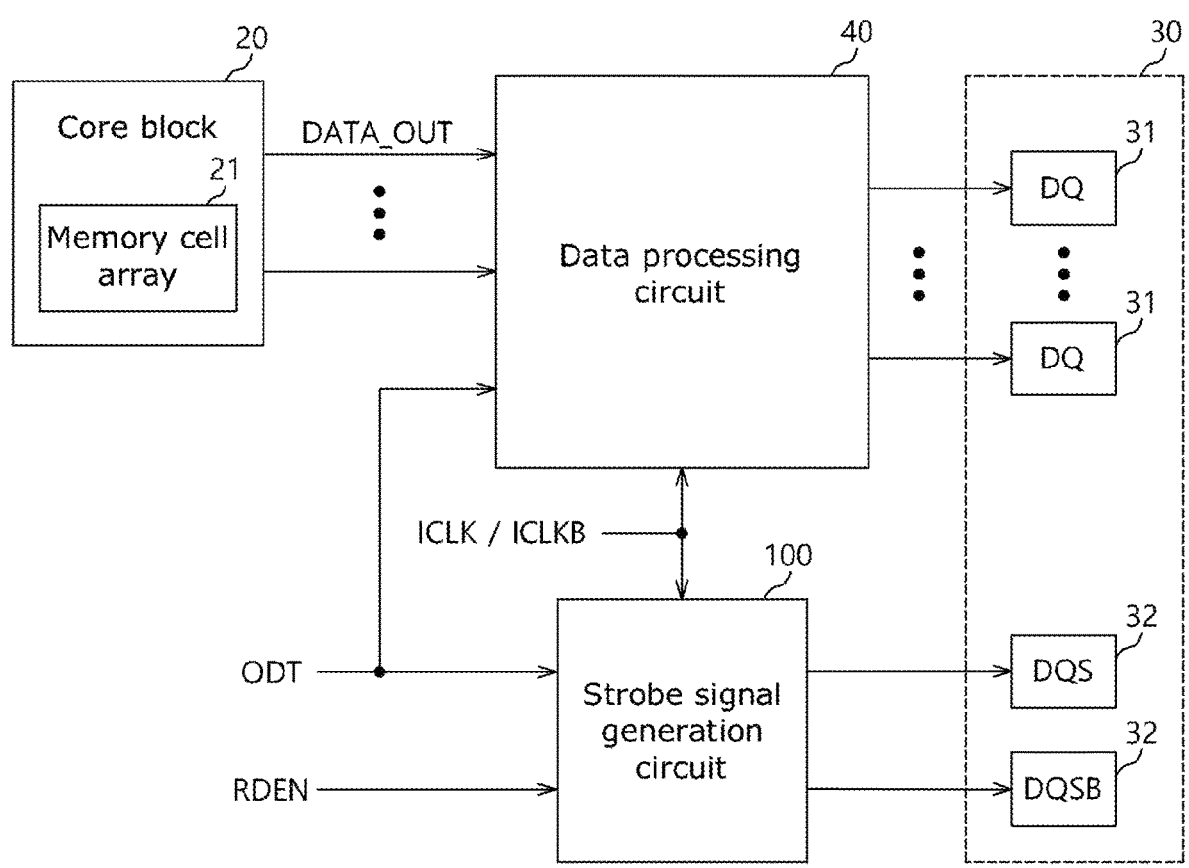
FIG. 1 is a diagram illustrating a representation of an example configuration of a semiconductor apparatus in accordance with an embodiment.

FIG. 1 is a diagram illustrating a representation of an example configuration of a semiconductor apparatus 10 in accordance with an embodiment.

As shown in FIG. 1, the semiconductor apparatus 10 in accordance with an embodiment may include a core block 20, a pad array 30, a data processing circuit 40, and a strobe signal generation circuit 100.

The core block 20 may include a memory cell array 21 and circuits (not shown) for performing input/output of data between the memory cell array 21 and an exterior of the memory cell array 21.

The pad array 30 may include pads 31 for the input/output of data, and pads 32 for the output of differential data strobe signals DQS and DQSB for notifying a receiving side of output data.

In a read operation, the data processing circuit 40 may serialize and drive parallel data DATA_OUT outputted from the core block 20, by using differential clock signals ICLK and ICLKB and an on-die termination signal ODT, and may output resultant data outside the semiconductor apparatus 10 through the pads 31. In an embodiment, the differential clock signal ICLK and ICLKB may include differential signals having opposite phases, and, as such, the clock signal ICLKB may be a clock bar signal ICLKB to that of clock signal ICLK and have an opposite phase to a phase of the clock signal ICLK. In some embodiments, the clock bar signal ICLKB may have a phase different from the clock signal ICLK by, for example but not limited to, 180 degrees. In some embodiments, the clock bar signal ICLKB may have an inverted phase of a phase of the clock signal ICLK.

The strobe signal generation circuit 100 may generate the differential data strobe signals DQS and DQSB in response to the differential clock signals ICLK and ICLKB, the on-die termination signal ODT, and a read enable signal RDEN.

The on-die termination signal ODT may be activated for a write operation period of the semiconductor apparatus 10, and the read enable signal RDEN may be activated for a read operation period of the semiconductor apparatus 10 in response to a read command.

Figure 2:
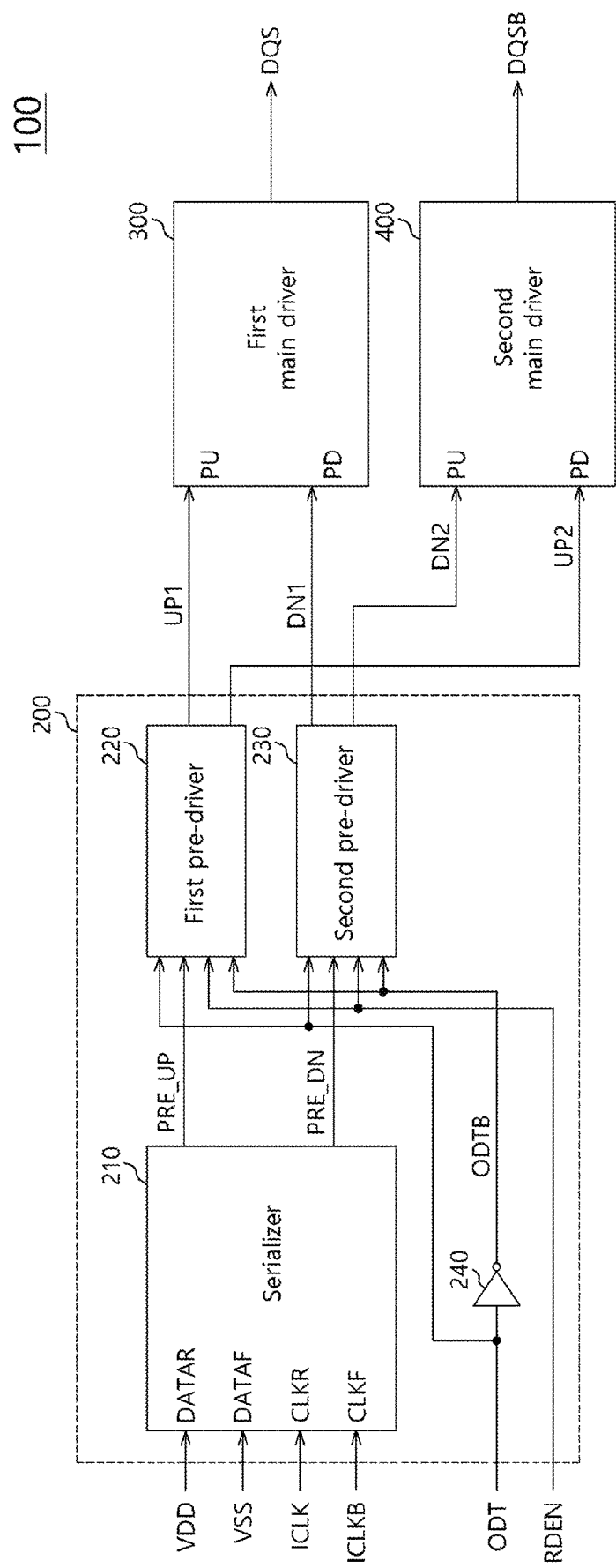
FIG. 2 is a diagram illustrating a representation of an example configuration of a strobe signal generation circuit in accordance with an embodiment.

FIG. 2 is a diagram illustrating a representation of an example configuration of the strobe signal generation circuit 100 in accordance with an embodiment.

As shown in FIG. 2, the strobe signal generation circuit 100 in accordance with an embodiment may include a trigger circuit 200, a first main driver 300, and a second main driver 400.

The trigger circuit 200 may generate pull-up signals and pull-down signals in response to clock signals in a read operation.

The first main driver 300 may generate a signal, for example, a data strobe signal DQS of the differential data strobe signals DQS and DQSB, by receiving a pull-up signal and a pull-down signal through a pull-up terminal and a pull-down terminal, respectively.

The second main driver 400 may generate an other signal, that is, a negative data strobe signal DQSB of the differential data strobe signals DQS and DQSB, by receiving a pull-up signal and a pull-down signal through a pull-up terminal and a pull-down terminal of opposite terminals than the first main driver 300 received the signals. In some embodiments, receiving a signal through opposite terminals may mean that if a pull-up terminal PU of the first main driver 300 receives a first pull-up signal UP1 and a pull-down terminal PD of the first main driver 300 receives a first pull-down signal DN1, then a pull-up terminal PU of the second main driver 400 may receive a second pull-down signal DN2 and a pull-down terminal PD of the second main driver 400 may receive a second pull-up signal UP2. In some embodiments, the data strobe signal DQSB of the differential data strobe signals DQS and DQSB may be a data strobe bar signal DQSB having a level opposite to a level of the data strobe signal DQS.

The trigger circuit 200 may generate the first and second pull-up signals UP1 and UP2 and the first and second pull-down signals DN1 and DN2 by using a power supply voltage VDD, a ground voltage VSS, the differential clock signals ICLK and ICLKB, the on-die termination signal ODT, and the read enable signal RDEN. In one embodiment, the first and second pull-up signals UP1 and UP2 may be considered to be one pull-up signal, and the first and second pull-down signals DN1 and DN2 may be considered to be one pull-down signal.

The trigger circuit 200 may include a serializer 210, a first pre-driver 220, and a second pre-driver 230.

The serializer 210 may generate a pre-pull-up signal PRE_UP and a pre-pull-down signal PRE_DN by serializing signals inputted through a first data input terminal DATAR and a second data input terminal DATAF, in response to signals inputted through a first clock input terminal CLKR and a second clock input terminal CLKF.

The serializer 210 receives the power supply voltage VDD through the first data input terminal DATAR, receives the ground voltage VSS through the second data input terminal DATAF, receives the clock signal ICLK through the first clock input terminal CLKR, and receives the negative clock signal ICLKB through the second clock input terminal CLKF.

The serializer 210 may be configured using a pipe latch (not shown).

The first pre-driver 220 may generate and output pull-up signals, that is, first and second pull-up signals UP1 and UP2, by driving the pre-pull-up signal PRE_UP in response to the read enable signal RDEN, the on-die termination signal ODT, and a negative on-die termination signal ODTB.

The second pre-driver 230 may generate and output pull-down signals, that is, first and second pull-down signals DN1 and DN2, by driving the pre-pull-down signal PRE_DN in response to the read enable signal RDEN, the on-die termination signal ODT, and the negative on-die termination signal ODTB.

The trigger circuit 200 may further include a logic gate 240 for generating the negative on-die termination signal ODTB by inverting the on-die termination signal ODT. In an embodiment, the logic gate 240 may generate an on-die termination bar signal ODTB by inverting the on-die termination signal ODT. Thus, in the embodiment, the on-die termination bar signal ODTB may have a level opposite to a level of the data strobe signal DQS.

While the embodiment illustrates an example in which the negative on-die termination signal ODTB is generated by using the logic gate 240, the negative on-die termination signal ODTB may be provided from another component in the semiconductor apparatus 10, and in this case, it is possible to remove the logic gate 240.

The first main driver 300 may generate the data strobe signal DQS according to the first pull-up signal UP1 outputted from the first pre-driver 220 and the first pull-down signal DN1 outputted from the second pre-driver 230.

The first main driver 300 may receive the first pull-up signal UP1 through the pull-up terminal PU, and may receive the first pull-down signal DN1 through a pull-down terminal PD.

The second main driver 400 may generate the negative data strobe signal DQSB according to the second pull-down signal DN2 outputted from the second pre-driver 230 and the second pull-up signal UP2 outputted from the first pre-driver 220.

The second main driver 400 receives the second pull-down signal DN2 through the pull-up terminal PU, and receives the second pull-up signal UP2 through the pull-down terminal PD.

In an embodiment, only one trigger circuit 200 is configured and, to generate the data strobe signal DQS and the negative data strobe signal DQSB having an opposite phase using the one trigger circuit 200, the second pull-down signal DN2 instead of the second pull-up signal UP2 is inputted to the pull-up terminal PU of the second main driver 400 and the second pull-up signal UP2 instead of the second pull-down signal DN2 is inputted to the pull-down terminal PD of the second main driver 400.

If another separate trigger circuit is used in addition to the trigger circuit 200 to generate the negative data strobe signal DQSB which should have a phase opposite to the data strobe signal DQS, the ground voltage VSS and the power supply voltage VDD should be inputted to the first data input terminal DATAR and the second data input terminal DATAF, respectively, of the serializer of the other trigger circuit, opposite the serializer 210 may reside in the other separate trigger circuit. However, when two trigger circuits are used to generate the data strobe signal DQS and the negative data strobe signal DQSB, problems may occur because a circuit area and power consumption may be greater than if there is only one trigger circuit.

Figure 3:
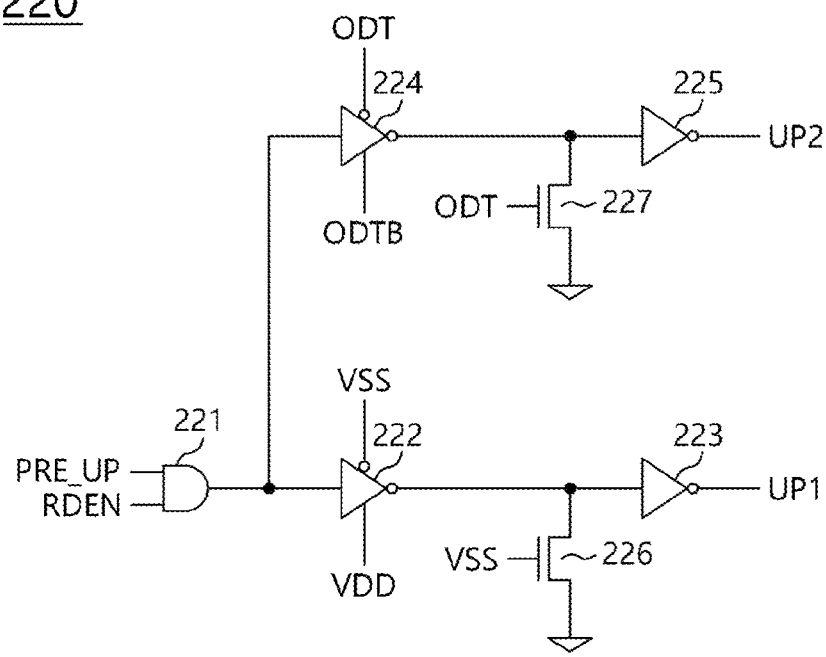
FIG. 3 is a diagram illustrating a representation of an example configuration of a first pre-driver shown in FIG. 2.

FIG. 3 is a diagram illustrating a representation of an example configuration of the first pre-driver 220 shown in FIG. 2.

As shown in FIG. 3, the first pre-driver 220 may include first to fifth logic gates 221 to 225 and first and second transistors 226 and 227.

The first logic gate 221 may AND the pre-pull-up signal PRE_UP and the read enable signal RDEN and provide an output.

The first logic gate 221 passes the pre-pull-up signal PRE_UP only when the read enable signal RDEN is activated to a high level.

When the read enable signal RDEN is deactivated to a low level (for example, a write operation), the first logic gate 221 may retain the first pull-up signal UP1 at a low level by causing the output terminal of the first logic gate 221 to transition to a low level.

The second logic gate 222 may receive the power supply voltage VDD and the ground voltage VSS through first and second control terminals, respectively, invert the output of the first logic gate 221 and provide an output to the third logic gate 223.

The third logic gate 223 may invert the output of the second logic gate 222 and output the first pull-up signal UP1.

The first transistor 226 may have a gate terminal which receives the ground voltage VSS, a source terminal which is coupled with a ground terminal, and a drain terminal which is coupled in common to the output terminal of the second logic gate 222 and the input terminal of the third logic gate 223.

The fourth logic gate 224 may receive the negative on-die termination signal ODTB and the on-die termination signal ODT through first and second control terminals, respectively, invert the output of the first logic gate 221 only when the negative on-die termination signal ODTB is deactivated, that is, a high level, and provide an output to the fifth logic gate 225.

The fifth logic gate 225 may invert the output of the fourth logic gate 224 and output the second pull-up signal UP2.

The second transistor 227 may have a gate terminal which receives the on-die termination signal ODT, a source terminal which is coupled with a ground terminal, and a drain terminal which is coupled in common to the output terminal of the fourth logic gate 224 and the input terminal of the fifth logic gate 225.

The second transistor 227 may pull-down the input terminal of the fifth logic gate 225 to a low level when the on-die termination signal ODT is activated, that is, a high level.

Figure 4:
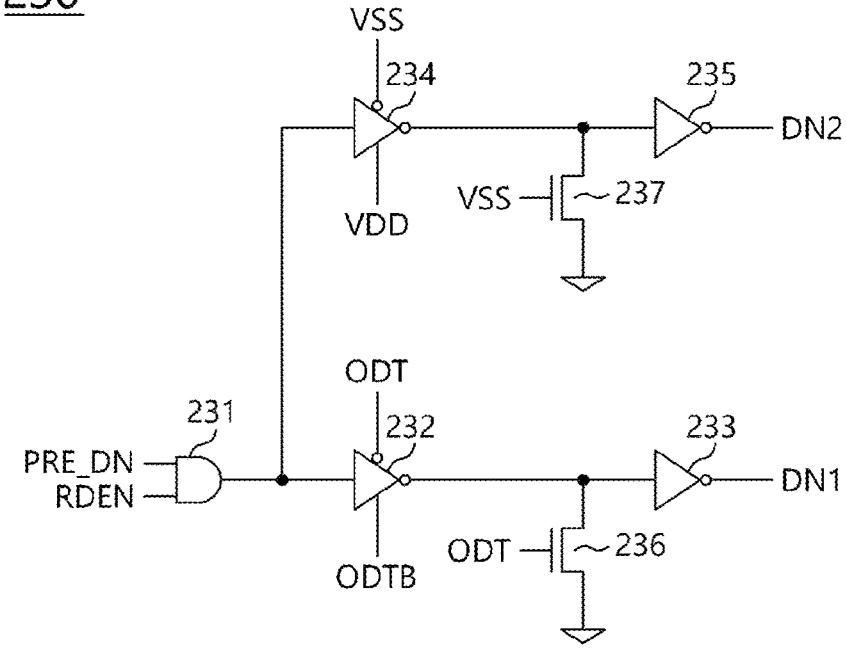
FIG. 4 is a diagram illustrating a representation of an example configuration of a second pre-driver shown in FIG. 2.

FIG. 4 is a diagram illustrating a representation of an example configuration of the second pre-driver 230 shown in FIG. 2.

As shown in FIG. 4, the second pre-driver 230 may include first to fifth logic gates 231 to 235 and first and second transistors 236 and 237.

The first logic gate 231 may AND the pre-pull-down signal PRE_DN and the read enable signal RDEN and provide an output.

The first logic gate 231 passes the pre-pull-down signal PRE_DN only when the read enable signal RDEN is activated to the high level.

When the read enable signal RDEN is deactivated to the low level (for example, a write operation), the first logic gate 231 may retain the first pull-down signal DN1 at a low level by causing the output terminal of the first logic gate 231 to transition to a low level.

The second logic gate 232 may receive the negative on-die termination signal ODTB and the on-die termination signal ODT through first and second control terminals, respectively, invert the output of the first logic gate 231 only when the negative on-die termination signal ODTB is deactivated, that is, the high level, and provide an output to the third logic gate 233.

The third logic gate 233 may invert the output of the second logic gate 232 and output the first pull-down signal DN1.

The first transistor 236 may have a gate terminal which receives the on-die termination signal ODT, a source terminal which is coupled with a ground terminal, and a drain terminal which is coupled in common to the output terminal of the second logic gate 232 and the input terminal of the third logic gate 233.

The first transistor 236 may pull-down the input terminal of the third logic gate 233 to a low level when the on-die termination signal ODT is activated, that is, the high level.

The fourth logic gate 234 may receive the power supply voltage VDD and the ground voltage VSS through first and second control terminals, respectively, invert the output of the first logic gate 231 and provide an output to the fifth logic gate 235.

The fifth logic gate 235 may invert the output of the fourth logic gate 234 and output the second pull-down signal DN2.

The second transistor 237 may have a gate terminal which receives the ground voltage VSS, a source terminal which is coupled with a ground terminal, and a drain terminal which is coupled in common to the output terminal of the fourth logic gate 234 and the input terminal of the fifth logic gate 235.

Figure 5:
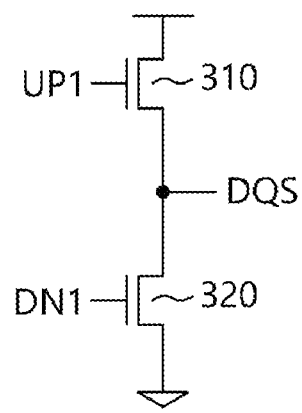
FIG. 5 is a diagram illustrating a representation of an example configuration of a first main driver shown in FIG. 2.

FIG. 5 is a diagram illustrating a representation of an example configuration of the first main driver 300 shown in FIG. 2.

As shown in FIG. 5, the first main driver 300 may include first and second transistors 310 and 320.

The first transistor 310 may have a gate terminal which receives the first pull-up signal UP1 and a source terminal to which a power supply terminal is coupled.

The second transistor 320 may have a gate terminal which receives the first pull-down signal DN1, a source terminal which is coupled with a ground terminal, and a drain terminal which is coupled with the drain terminal of the first transistor 310.

The data strobe signal DQS may be outputted from a node to which the drain terminal of the first transistor 310 and the drain terminal of the second transistor 320 are coupled.

Figure 6:
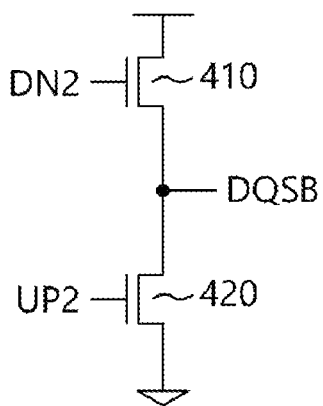
FIG. 6 is a diagram illustrating a representation of an example configuration of a second main driver shown in FIG. 2.

FIG. 6 is a diagram illustrating a representation of an example configuration of the second main driver 400 shown in FIG. 2.

As shown in FIG. 6, the second main driver 400 may include first and second transistors 410 and 420.

The first transistor 410 may have a gate terminal which receives the second pull-down signal DN2 and a source terminal to which a power supply terminal is coupled.

The second transistor 420 may have a gate terminal which receives the second pull-up signal UP2, a source terminal which is coupled with a ground terminal, and a drain terminal which is coupled with the drain terminal of the first transistor 410.

The negative data strobe signal DQSB may be outputted from a node to which the drain terminal of the first transistor 410 and the drain terminal of the second transistor 420 are coupled.

Figure 7:
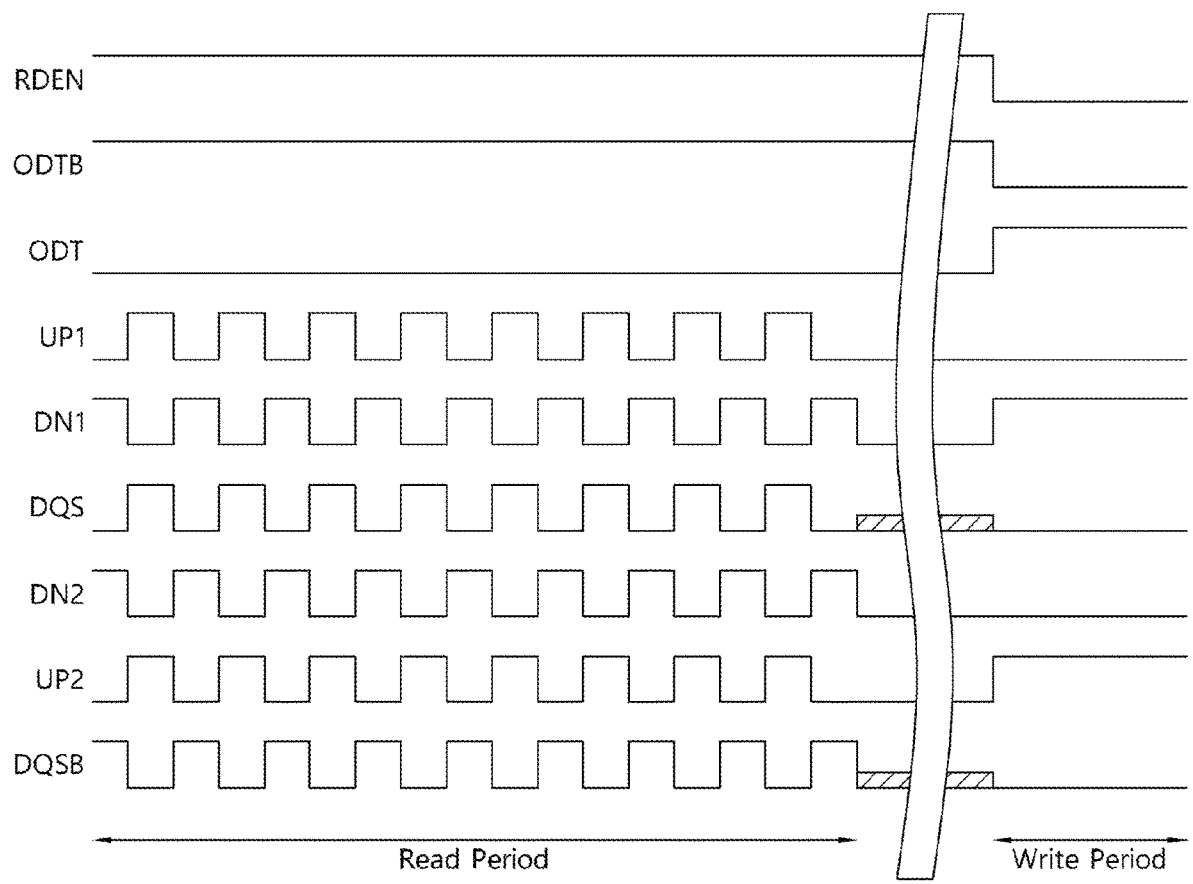
FIG. 7 is a representation of an example timing diagram of a strobe signal generation scheme in accordance with an embodiment.

FIG. 7 is a representation of an example timing diagram to assist in an explanation of a strobe signal generation scheme in accordance with an embodiment.

As shown in FIG. 7, for the read operation period of the semiconductor apparatus 10 the read enable signal RDEN retains the high level, the on-die termination signal ODT retains a deactivated level, that is, a low level, and the negative on-die termination signal ODTB retains the high level.

The first pre-driver 220 may generate the first and second pull-up signals UP1 and UP2 which have the same phase, according to the pre-pull-up signal PRE_UP.

The second pre-driver 230 may generate the first and second pull-down signals DN1 and DN2 which have the same phase, according to the pre-pull-down signal PRE_DN.

The first main driver 300 may generate the high level period of the data strobe signal DQS according to the high level period of the first pull-up signal UP1, and may generate the low level period of the data strobe signal DQS according to the high level period of the first pull-down signal DN1.

The second main driver 400 may generate the high level period of the negative data strobe signal DQSB according to the high level period of the second pull-down signal DN2, and may generate the low level period of the negative data strobe signal DQSB according to the high level period of the second pull-up signal UP2.

For the write operation period of the semiconductor apparatus 10, the read enable signal RDEN retains the low level, the on-die termination signal ODT retains the activated level, that is, the high level, and the negative on-die termination signal ODTB retains a low level.

The first pre-driver 220 may retain the first pull-up signal UP1 at a low level because the read enable signal RDEN is the low level, and may retain the second pull-up signal UP2 at the high level because the on-die termination signal ODT is the high level.

The second pre-driver 230 may retain the second pull-down signal DN2 at a low level because the read enable signal RDEN is the low level, and may retain the first pull-down signal DN1 at the high level because the on-die termination signal ODT is the high level.

The first main driver 300 may retain the data strobe signal DQS at the low level because the first pull-up signal UP1 is the low level and the first pull-down signal DN1 is the high level.

The second main driver 400 may retain the negative data strobe signal DQSB at the low level because the second pull-down signal DN2 is the low level and the second pull-up signal UP2 is the high level.

While various embodiments have been described above, it will be understood by those skilled in the art that the embodiments described are examples only. Accordingly, the strobe signal generation circuit and the semiconductor apparatus including the same described herein should not be limited based on the described embodiments.

What is claimed is:

1. A strobe signal generation circuit comprising:
   a serializer configured to generate a pre-pull-up signal and a pre-pull-down signal by serializing signals inputted through a first data input terminal and a second data input terminal, according to a differential clock signals;
   a first pre-driver configured to generate a first pull-up signal and a second pull-up signal by driving the pre-pull-up signal based on an on-die termination signal;
   a second pre-driver configured to generate a first pull-down signal and a second pull-down signal by driving the pre-pull-down signal based on the on-die termination signal;
   a first main driver configured to generate a differential data strobe signal in response to receiving the first pull-up signal and the first pull-down signal; and
   a second main driver configured to generate an other differential data strobe signal in response to receiving the second pull-up signal and the second pull-down signal through opposite terminals compared to the first main driver, with the pull-up signal going to a ground.

2. The strobe signal generation circuit according to claim 1, wherein the serializer is configured to receive a power supply voltage through the first data input terminal and receive a ground voltage through the second data input terminal.

3. The strobe signal generation circuit according to claim 1, wherein the first pre-driver is configured to generate the first pull-up signal by driving the pre-pull-up signal and generate the second pull-up signal by driving the pre-pull-up signal based on the on-die termination signal.

4. The strobe signal generation circuit according to claim 1, wherein the second pre-driver is configured to generate the second pull-down signal by driving the pre-pull-down signal and generate the first pull-down signal by driving the pre-pull-down signal based on the on-die termination signal.

5. The strobe signal generation circuit according to claim 1, wherein the first main driver is configured to receive the first pull-up signal through a first pull-up terminal and the first pull-down signal through a first pull-down terminal and configured to generate the differential data strobe signal based on the first pull-up signal and the first pull-down signal.

6. The strobe signal generation circuit according to claim 5, wherein the second main driver is configured to receive the second pull-down signal through a second pull-up terminal and the second pull-up signal through a second pull-down terminal and configured to generate the other differential data strobe signal based on the second pull-down signal and the second-pull up signal.

7. The strobe signal generation circuit according to claim 1, wherein the second main driver is configured to generate the other differential data strobe signal having an opposite phase than the differential data strobe signal.

8. The strobe signal generation circuit according to claim 1, wherein the on-die termination signal is activated for a write operation period of a semiconductor apparatus.

9. A semiconductor apparatus comprising:
   a core block including a memory cell array;
   a pad array including pads for input/output of data and pads for outputting differential data strobe signals for notifying a receiving side of output data;
   a data processing circuit configured to, in a read operation, serialize and drive parallel data outputted from the core block, by using a clock signal, and output resultant data through the pads for input/output of data to an exterior of the semiconductor apparatus; and a strobe signal generation circuit configured to generate the differential data strobe signals according to the clock signal, the strobe signal generation circuit comprising:
- a serializer configured to generate a pre-pull-up signal and a pre-pull-down signal by serializing signals inputted through a first data input terminal and a second data input terminal, according to a differential clock signals,
- a first pre-driver configured to generate a first pull-up signal and a second pull-up signal by driving the pre-pull-up signal based on an on-die termination signal,
- a second pre-driver configured to generate a first pull-down signal and a second pull-down signal by driving the pre-pull-down signal based on the on-die termination signal,
- a first main driver configured to generate a differential data strobe signal in response to receiving a pull-up signal from among the at least one pull-up signal and a pull-down signal from among the at least one pull-down signal; and
- a second main driver configured to generate an other differential data strobe signal in response to receiving an other pull-up signal from among the at least one pull-up signal and an other pull-down signal from among the at least one pull-down signal through opposite terminals compared to the first main driver, with the pull-up signal going to a ground.

10. The semiconductor apparatus according to claim 9, wherein the serializer is configured to receive a power supply voltage through the first data input terminal and receive a ground voltage through the second data input terminal.

11. The semiconductor apparatus according to claim 9, wherein the first main driver is configured to receive the pull-up signal through a pull-up terminal and receive the pull-down signal through a pull-down terminal.

12. The semiconductor apparatus according to claim 11, wherein the second main driver is configured to receive the other pull-down signal through a pull-up terminal and receive the other pull-up signal through a pull-down terminal.

13. The semiconductor apparatus according to claim 9, wherein the second main driver is configured to generate the other differential data strobe signal having an opposite phase than the differential data strobe signal.

14. The semiconductor apparatus according to claim 9, wherein the on-die termination signal is activated for a write operation period of a semiconductor apparatus.

* * * * *